(12) United States Patent
Hilpert et al.

(10) Patent No.: US 7,827,910 B2
(45) Date of Patent: Nov. 9, 2010

(54) METHOD OF TRANSPORTING AND PRINTING OF PRINTED MATERIAL AND PRINTING TABLE FOR A FLATBED PRINTING MACHINE

(75) Inventors: Markus Hilpert, Gundelfingen (DE); Michael Reichenbach, Waldkirch (DE)

(73) Assignee: Thieme GmbH & Co. KG, Teningen (DE)

( * ) Notice: Subject to any disclaimer, the term of this patent is extended or adjusted under 35 U.S.C. 154(b) by 812 days.

(21) Appl. No.: 11/727,388

(22) Filed: Mar. 26, 2007

(65) Prior Publication Data
US 2008/0034990 A1 Feb. 14, 2008

Related U.S. Application Data

(60) Provisional application No. 60/859,485, filed on Nov. 17, 2006.

(30) Foreign Application Priority Data
Mar. 27, 2006 (DE) .................. 10 2006 015 686

(51) Int. Cl.
*B41M 1/12* (2006.01)
(52) U.S. Cl. ............ 101/129; 101/123; 101/126
(58) Field of Classification Search ........... 101/114, 101/115, 123, 126, 129
See application file for complete search history.

(56) References Cited

U.S. PATENT DOCUMENTS

| | | | |
|---|---|---|---|
| 4,729,468 A * | 3/1988 | Pinck | 198/810.02 |
| 4,813,352 A * | 3/1989 | Ericsson | 101/126 |
| 5,410,957 A * | 5/1995 | Tanaka et al. | 101/127 |
| 6,367,378 B1 * | 4/2002 | Yamazaki | 101/129 |
| 6,543,346 B2 | 4/2003 | Rodefeld | |
| 2009/0020392 A1 * | 1/2009 | Koenig et al. | 198/345.2 |

FOREIGN PATENT DOCUMENTS

| | | |
|---|---|---|
| DE | 100 32 525 A1 | 1/2002 |
| EP | 0 535 338 A1 | 4/1993 |
| EP | 0 535 399 A2 | 4/1993 |

OTHER PUBLICATIONS

Corresponding German Opposition Brief dated Nov. 9, 2007 (Eleven (11) pages).

(Continued)

*Primary Examiner*—Ren Yan
(74) *Attorney, Agent, or Firm*—Crowell & Moring LLP

(57) ABSTRACT

A method of conveying imprint material and a printing table for a flatbed printing machine are described. The method of conveying imprint material, particularly solar cell wafers, in and out of a processing area of a flatbed printing machine includes the steps of moving the imprint material by means of a conveyor belt on a first conveyor belt section into the processing area, processing the imprint material and further moving the imprint material on the first conveyor belt section out of the processing area. An automatic checking of the first conveyor belt section for soiling or damage takes place and, as a function of the checking result, a moving-back of the first conveyor belt section into the processing area or a moving of a second conveyor belt section into the processing area takes place.

16 Claims, 8 Drawing Sheets

OTHER PUBLICATIONS

Photon International (The Photovoltaic Magazine), Jul. 2005, pp. 5, and 62-69, www.photon-magazine.com.

Supply Agreement between Sunways Production GmbH and Baccini S.P.A. dated Dec. 30, 2004 (Fifty-three (53) pages).

Sales invoice between Baccini S.P.A. and Sunway Productions GmbH dated Jun. 27, 2005.

Sales invoice between Baccini S.P.A. and Sunway Productions GmbH dated Mar. 8, 2005.

Sunways, Automatic Printer Software Menu (Item 1), Jul. 26, 2005, pp. 1-12, File: 2004 1030 Software Menu.doc Ver. 1.0, http://www.baccini.com.

International Search Report dated Jul. 27, 2007 with an English translation of the pertinent portions (Eleven (11) pages).

* cited by examiner

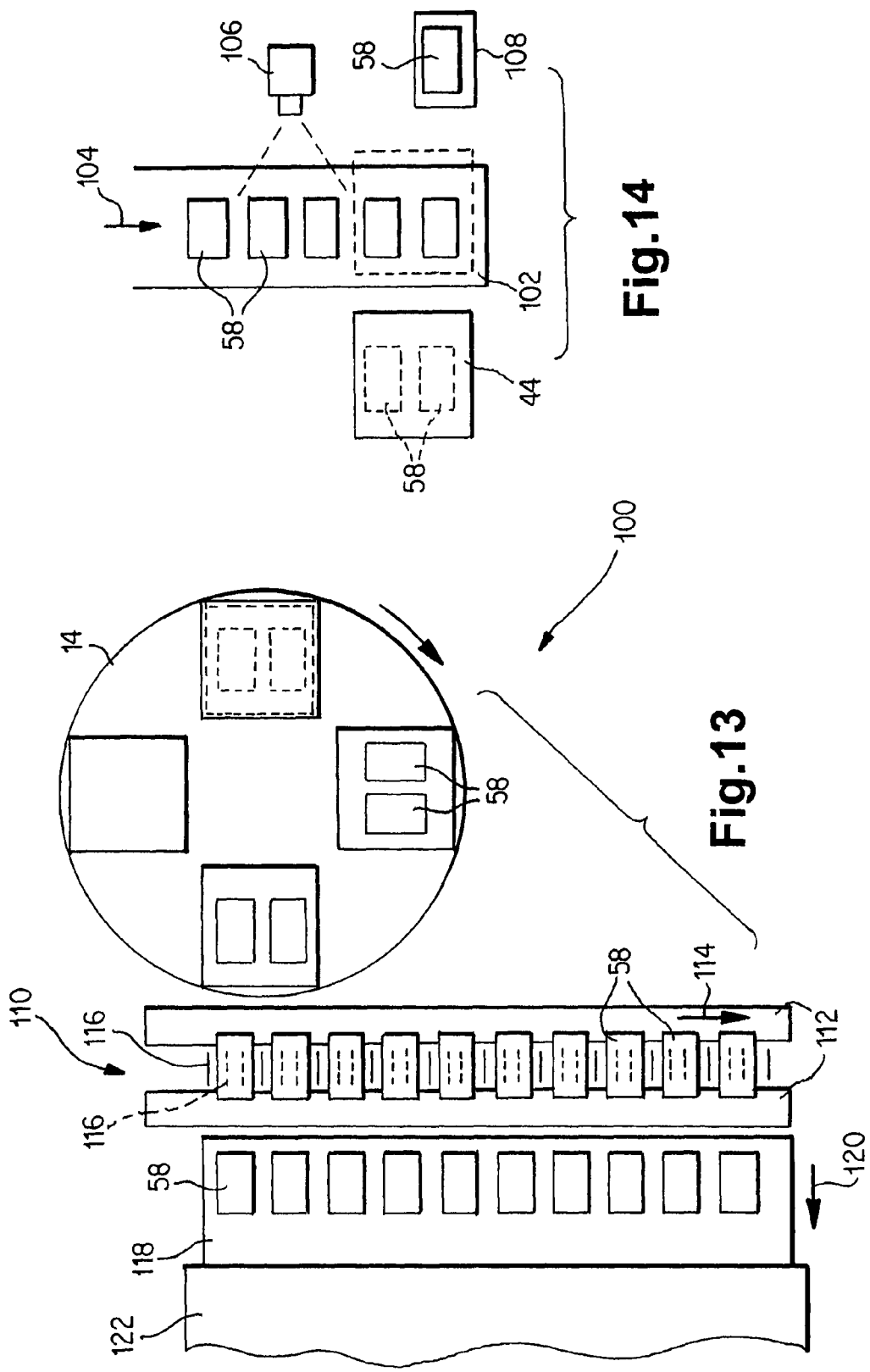

METHOD OF TRANSPORTING AND PRINTING OF PRINTED MATERIAL AND PRINTING TABLE FOR A FLATBED PRINTING MACHINE

CROSS REFERENCE TO RELATED APPLICATIONS

This application claims the benefit under 35 U.S.C. §119 (e) to U.S. Provisional Patent Application Ser. No. 60/859,485 filed Nov. 17, 2006, and claims priority under 35 U.S.C. §119 to German Patent Application No. 10 2006 015 686.2 filed Mar. 27, 2006, the entire disclosures of which are herein expressly incorporated by reference.

BACKGROUND AND SUMMARY OF THE INVENTION

The invention relates to a method of conveying imprint material, particularly solar cells, from a processing area of a flatbed printing machine, by which the imprint material is first positioned on a first conveyer belt section, by which the imprint material is then processed and by which the imprint material on the first conveyer belt section is then moved further out of the processing area. The invention also relates to a method of imprinting plates of imprint material, particularly solar cell wafers. The invention further relates to a printing table for a flatbed printing machine, particularly for the screen printing of solar cell wafers, having a conveyor belt for conveying imprint material from a processing area of the printing table during processing, the imprint material resting on a first conveyor belt section, and having at least one driving device for moving the conveyor belt over the printing table.

According to the invention, a method is provided for conveying and imprinting a sensitive imprint material as well as a printing table for sensitive imprint material, particularly a thin solar cell wafer or thin glass.

According to the invention, a method of conveying imprint material, particularly solar cells, from a processing area of a flatbed printing machine is provided, having the following steps: Positioning the imprint material on a first conveyor belt section of a conveyor belt in the processing area, processing the imprint material, further moving the imprint material on the first conveyor belt section out of the processing area, automatically checking of the first conveyor belt section for soiling or damage and, as a function of the checking result, further positioning the imprint material on the first conveyor belt section or moving a second conveyor belt section into the bearing area.

Using an exemplary method according to the invention, it can be ensured that imprint material positioned in the processing area will rest on a clean conveyor belt section which is not soiled or damaged. Specifically in the case of a sensitive imprint material, for example, of solar cells or thin glass susceptible to breaking, it may happen that the wafer breaks during the imprinting of the strip conductors. Even after the removal of this broken wafer, it is probable that splinters or printing paste may still adhere to the conveyor belt, which leads to the danger that wafers processed subsequently will also be soiled or damaged. According to the invention, the first conveyor belt section is automatically checked for soiling or damage and, as a function of the result of the checking step, is either used again for the bearing of imprint material, or a second clean conveyor belt section is moved into the bearing area. This ensures that no splinter, residues or printing paste or the like are present on the conveyor belt section on which the imprint material is conveyed into the processing area. The conveyor belt consists, for example, of a paper web. As a function of the result of the checking step, a soiled or damaged paper web section is rolled up and no longer used. On the other hand, if the paper web section is not soiled or damaged, it will be used again. Particularly in the case of continuous processes for high numbers of pieces, this process reduces the paper web consumption and especially the downtimes for the reloading of the paper web can be considerably decreased.

As a further development of the invention, the first conveying section may be moved back into the processing area as a function of the checking result. In this case, the checking of the first conveyor belt section takes place outside the processing area, for example, below the processing area. If it is determined in that the first conveyor belt section is damaged, a second conveyor belt section is already situated on the printing table in the processing area.

As a further development of the invention, the first conveyor belt section may be moved back into the processing area and, depending on the result of the checking step, a second conveyor belt section may be moved into the processing area.

In this case, the checking of the first conveyor belt section takes place in the processing area, so that monitoring cameras can be arranged above or diagonally above the processing area. Thus, if the first conveyor belt section is determined to still be good and continuously usable, no further conveyor belt movement would be required because the first conveyor belt section had been moved back into the processing area even before the check.

A further embodiment of the invention provides an automatic checking of the processed imprint material for damage or soiling in the processing area and, as a function of the checking result, the further processing of the imprint material and the removal of the imprint material from the processing operation.

For example, if a solar cell wafer breaks during the imprinting, the latter has to be removed from the processing operation. In this situation, further checks may be automatically triggered, which determine the integrity of the conveying and printing devices.

In a further embodiment of the invention, the imprint material may be imprinted in the processing area by means of screen printing and, after the imprinting, an automatic checking of a printing screen may take place for damage or soiling. If the checking finds damage or soiling, the printing screen may be removed by means of a scraper or the like.

For example, in the event of broken solar cell wafers during the imprinting, splinters may adhere to the printing screen, which would make also subsequent printing operations faulty, or destroy the screen mesh printing stencil. It is therefore advantageous, if necessary, to also check the printing screen after the imprinting for damage or soiling, depending on results of the checking step, and if necessary, to scrape the printing screen by means of a scraper or the like in order to remove splinters or soiling therefrom. The printing screen may be advantageously moistened before, during or after the removal in order to partially detach undesirable residues from the printing screen.

In a further embodiment of the invention, after the imprinting of the imprint material and after the automatic checking of a printing screen following the imprinting, free-printing of the printing screen onto the first conveyor belt section and movement of a second conveyor belt into the processing area may be carried out as a result of the checking operation.

Especially when splinters or other soiling materials adhere to the printing screen, the latter can generally be cleaned again by free-printing. According to the invention, free-printing takes place in a particularly simple manner on the first conveyor belt section, and subsequently a clean second conveyor belt section is moved into the processing area. Particularly advantageously, this can also be used when the conveyor belt is constructed as a paper web. However, it will be understood that one may use other conveyor belts which are not necessarily usable only once. For example, the then imprinted first conveyor belt section may be part of a revolving conveyor belt and can be cleaned in a cleaning station and then can be used again.

As a further embodiment of the invention, a printing image of the free-printing on the first conveyor belt section may be checked automatically. By checking the printing image after the optionally repeated free-printing, contamination or damage to the printing screen can be determined. The checking takes place, for example, by means of cameras and an image processing unit on the output side. The free-printing can, for example, be repeated until the printing image during the free-printing indicates an undamaged and clean printing screen.

As a further embodiment of the invention, the checking of the printing screen may be initiated as a function of the result of an automatic checking of the processed imprint material.

For example, checking of the printing screen may be initiated only if the imprint material was damaged during the printing operation. For example, imprinted solar cell wafers may be checked for fracturing by a transmitted-light method and, as a function of the result of this check, if a fracturing of the wafer is determined the printing screen may be checked for contamination and damage.

According to the invention, an exemplary method of imprinting imprint material plates, particularly solar cell wafers, by means of a screen printing machine, includes the following steps: aligning of at least two imprint material plates relative to one another, positioning of the at least two mutually aligned imprint material plates in the processing area of the screen printing machine, for example on a conveyor belt, and simultaneous processing the at least two imprint material plates and further moving the at least two imprint material plates out of the processing area, for example on the conveyor belt.

The exemplary method provides a double benefit or even multiple benefits since two or more imprint material plates can be simultaneously processed on a single printing table and by means of a single printing screen. Since the printing operation itself is comparatively time-consuming, a very high throughput can be achieved in this manner, which is extremely advantageous, for example, in the mass production of solar cell wafers. In this case, it is preferred that the at least two imprint material plates are aligned relative to one another so that in the mutually aligned condition they can then be positioned on the conveyor belt in the processing area of the screen printing machine. Thus, the imprint material plates are thereby aligned with respect to the printing screen, but the printing screen itself may no longer have to be aligned. The normally required alignment of the printing screen with respect to the imprint material therefore can be eliminated. By using the alignment of the printing screen, only an exact positioning relative to one of the at least two imprint material plates could be achieved. However, according to the invention, the two imprint material plates are deposited on the imprint material bearing device already in a mutually substantially aligned manner, and are therefore already in the correct position such that the printing takes place simultaneously onto the at least two imprint material plates through the printing screen.

However, the printing screen can also still be aligned. This may be necessary in the event that the printing screen was not placed correctly by means of a 3-point contact in the machine, or when faults during the screen production are to be compensated.

As a further embodiment of the invention, the alignment of the at least two imprint material plates comprises lifting the at least two imprint material plates and moving them relative to one another in the lifted condition.

In this manner, the imprint material plates, such as sensitive solar cell wafers, can be aligned relative to one another in a device in the lifted condition, and the imprint material plates therefore do not have to be displaced on a base and be placed, for example, against stops. In the lifted condition, a very precise mutual alignment of the imprint material plates can thereby be achieved while being handled very carefully. The imprint material plates, which are exactly aligned with respect to one another, are then deposited on the printing table in the exactly intended position and are therefore already correctly aligned with respect to the printing screen. As a result, the two imprint material plates situated side-by-side can be imprinted with a high precision by means of a single printing screen. A double benefit is again achieved, and it is further possible to process more than two imprint material plates in this manner in order to achieve a multiple benefit.

As a further embodiment of the invention, at least two imprint material plates are checked simultaneously. If some solar cell wafers are determined to be in poor condition, other solar cell wafers that are assessed to be good are moved into a parked position, while the solar cell wafers evaluated to be poor are sorted out.

In this manner, at least two imprint material plates can be processed simultaneously. After the check, the solar cell wafers are lifted and, in the lifted condition, are then aligned relative to one another. In order to be able to process the supplied groups having of at least two imprint material plates, faulty imprint material plates are sorted out, while the remaining good imprint material plates are first parked. When additional imprint material plates are again evaluated as bad, a complete group of imprint material plates evaluated as good can be assembled again.

As a further embodiment of the invention, the processed imprint material plates are dried in a run-through dryer, at least two imprint material plates being arranged side-by-side on a conveyor belt of the run-through dryer.

Providing a run-through dryer with a conveyor belt permits the easy transfer of imprinted imprint material plates to the conveyor belt, without having to lift the imprint material plates once again. In order to achieve a high throughput in the dryer, at least two groups of imprint material plates are respectively arranged side-by-side on the conveyor belt. When, for example, two solar cell wafers are simultaneously imprinted, ten imprinted solar cell wafers may be arranged side-by-side in the run-through dryer and are moved through the run-through dryer.

As a further embodiment of the invention, the printing screen may be lifted and/or swiveled during the printing operation. By means of such a screen lift, a clean printing image is achieved due to the lifting of the printing screen, because when the printing screen is lifted off the imprint material after the imprinting of a respective location, a printing squeegee is moved over it.

The embodiments of the present invention include a printing table for a flatbed printing machine, particularly for the screen printing of solar cell wafers, having a conveyor belt for the conveying imprint material, for example out of a processing area of the printing table. During this processing, the imprint material resting on a first conveyor belt section passed along at least one driving device for moving the conveyor belt over the printing table, a checking device for checking at least the first conveyor belt section for contamination and damage after a further conveying of the imprint material, and a control unit. The control unit controls the at least one driving device as a function of the checking result of the checking device, such that either the first conveyor belt section is moved back into the processing area after the further conveying of the imprint material, or a second conveyor belt section is moved back into the processing area. However, generally only two solar cell wafers may be moved directly side-by-side through the dryer. This has the advantage that additional operating steps can be eliminated.

Using the printing table according to the invention, it can be ensured that a clear and undamaged conveyor belt is always available for the processing of sensitive imprint material.

As a further embodiment of the invention, the conveyor belt may be constructed as a paper web. Paper to use in a conveyor belt is available at reasonable cost, so that damaged sections can be disposed of. However, as explained above, by using the embodiments of the invention, the paper web consumption is nevertheless significantly minimized. Furthermore, a paper web can hold possibly leaked printing ink so that additional printing machine parts will not be soiled.

As a further embodiment of the invention, viewed in the conveying direction, rollers can be provided on both sides of the printing table for the rolling-up or unrolling of the conveyor belt.

In this manner, large quantities of conveyor belt material, such as a paper web, can be held in the clean as well as in the soiled condition, so that in connection with the multiple utilization of the paper web sections according to the invention, downtime for exchanging the conveyor belt can be significantly reduced.

As a further embodiment of the invention, at least one of the rollers may be arranged to be movable relative to the printing table bearing surface.

As a result of the movable arrangement of at least of one of the rollers, a movement of the first conveyor belt section downward from the printing table bearing surface or upward onto the latter can take place without a rotation of this at least one roller. Specifically, at least one of the rollers is swiveled or displaced in order to move the first conveyor belt section out of the processing area on the printing table bearing surface, and to then mount this first conveyor belt section away from the printing table bearing surface, particularly in a flat manner. On the one hand, the first conveyor belt section can thereby be checked for soiling and damage outside the printing table bearing surface. On the other hand, it can be achieved that the at least one roller always only has to be moved in the same rotating direction. This is particularly important when there is the danger that printing ink or other more or less strongly adhering substances reach the conveyor belt. When both rollers are fixedly and non-displaceably mounted, in order to move the first conveyor belt section downward from the printing table bearing surface and then to move it back again, both rollers first have to be moved into one rotating direction and then into the other rotating direction. If an adhering substance such as printing ink or printing paste for strip conductors arrives on the conveyor belt, especially the paper web, a paper web section soiled by the printing paste eventually may be wound onto a paper web section already situated on the roller, which paper web section is also already soiled by printing paste. This situation may lead to a thorough moistening of the paper web and possibly to a tearing of the paper web. It may also lead to a gluing-together of the stacked paper web layers. In a worst case, this condition leads to a blocking of the entire paper web. This is not the case according to the embodiments of the invention, wherein at least one of the rollers, specifically the roller onto which the soiled paper web is wound, is always only rotated in one direction, and wherein paper web sections soiled by the still moist printing paste are also wound on one another. However, these paper web sections then no longer have to be separated from one another, so that a possible gluing-together of the paper webs is of no consequence.

As a further embodiment of the invention, at least one of the rollers may be displaceably disposed in guide rails.

For example, at least one of the rollers can be displaceably disposed in guide rails arranged vertically with respect to the printing table surface. This roller, onto which the soiled paper web is wound, can then keep the paper web tensioned as a result of its own weight. When the additional roller situated on the opposite side of the printing table bearing surface dispenses a length of conveyor belt, this roller is displaced by its own weight downward along the vertically arranged guide rail. The first conveyor belt section from the processing area thereby becomes flat and is mounted outside the printing table bearing surface and, as required, may be checked for soiling and damage. When the conveyor belt is again wound onto the opposite roller, this roller is then pulled upward again along the guide rails. This is also the case when this exemplary roller is caused to rotate to wind-up soiled paper belt. The roller, which is to receive the soiled conveyor belt and which is disposed in the vertical guide rails, therefore only has to be able to rotate in one rotating direction and may be provided, for example, with a free-wheel.

As a further embodiment of the invention, the checking device has at least one camera and image processing devices.

The conveyor belt can be checked by means of a camera and, as required, by means of varied lighting. Lighting can take place, for example from above, laterally or from below. Suitable image processing devices can detect damage or soiling of the conveyor belt and, as a function of the checking result, can trigger a driving device for the conveyor belt such that a new clean and undamaged conveyor belt section reaches the processing area.

As a further embodiment of the invention, the conveyor belt can have an air-permeable construction, and the printing table bearing surface can be provided with intake openings for the application of a vacuum.

A paper web may, for example, have a blotting-paper-like and therefore air-permeable construction in order to hold sensitive imprint material on the printing table during the printing operation, without the risk of damage, and reliably and with the required precision.

As a further embodiment of the invention, an elastic intermediate layer, particularly a rubber layer, may be arranged between the conveyor belt and the printing table bearing surface.

Particularly in the case of very sensitive imprint material, for example solar cell wafers, which are extremely susceptible to fracturing and which at the same time are not completely flat, an elastic intermediate layer can further reduce the risk of fracturing during the printing operation.

For example, a silicone rubber layer may be arranged below the conveyor belt, and may be provided with passage bores in the raster of the intake openings provided in the printing table.

As a further development of the invention, a cleaning device can be provided which has a scraper or similar element for cleaning a printing screen. The cleaning device advantageously also has a moistening element for moistening the printing screen.

By means of such a cleaning device, it can be ensured, for example, after the fracturing of a solar cell wafer, that splinters or other dirt that would impair subsequent printing operations, no longer adhere to the printing screen. After the lifting of the printing screen, the cleaning device with the scraper or the similar element is moved along the underside of the printing screen and thereby scrapes ink residues and splinters possibly adhering to the ink residues off the printing screen. A moistening of the printing screen can partially detach possible residues during the cleaning.

Additional characteristics and advantages of the invention are found in the claims and the following description in connection with the drawings. Individual characteristics of the different embodiments can also be combined arbitrarily without exceeding the scope of the invention.

Other objects, advantages and novel features of the present invention will become apparent from the following detailed description of the invention when considered in conjunction with the accompanying drawings.

BRIEF DESCRIPTION OF THE DRAWINGS

FIGS. 13 and 14 show a schematic representation of an arrangement for imprinting solar cell wafers.

DETAILED DESCRIPTION OF THE DRAWINGS

Figure 1:
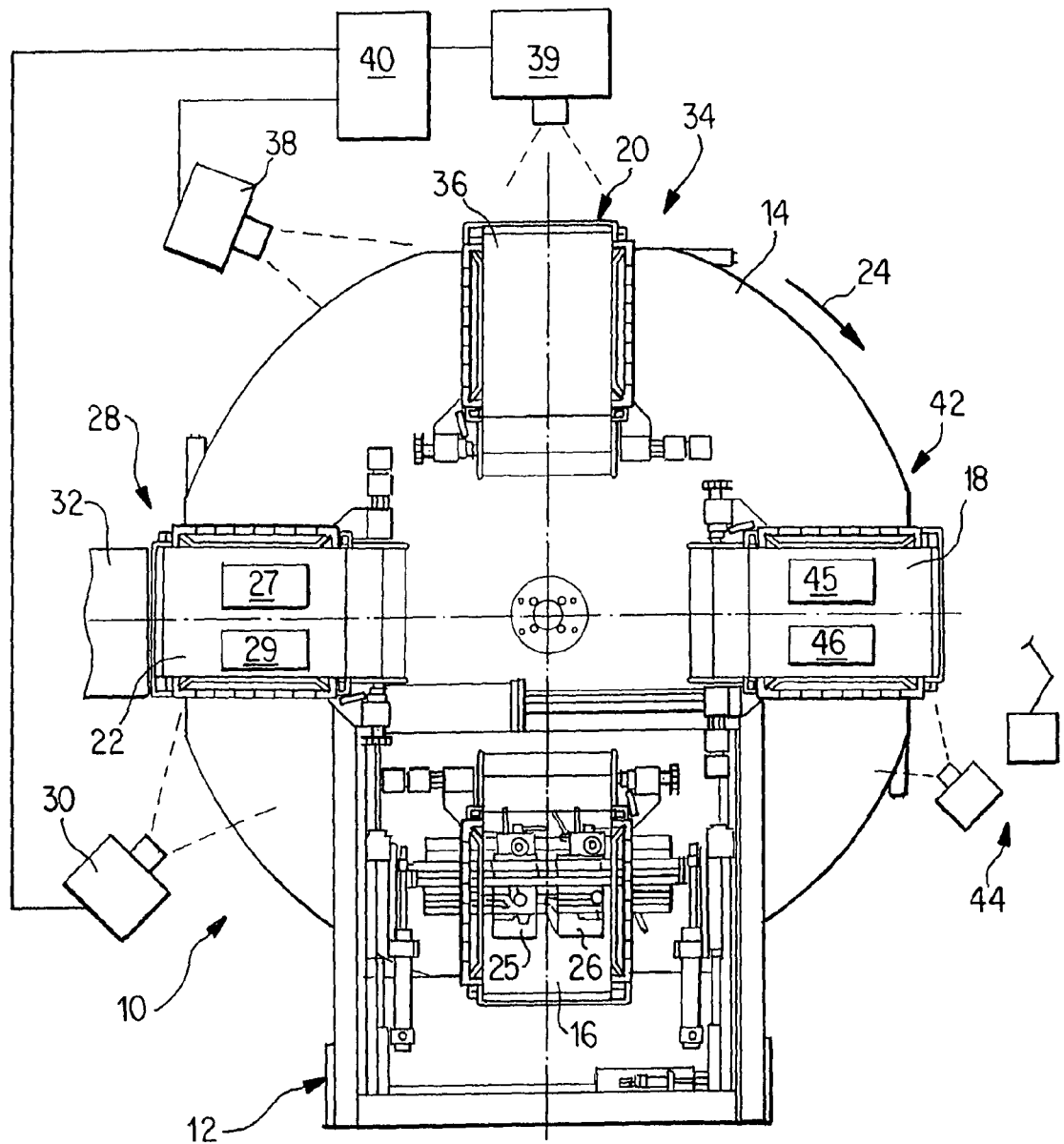
FIG. 1 is a top view of a flatbed printing machine with a total of four printing tables according to the invention, on a rotary indexing table.

The representation of FIG. 1 is a top view of an exemplary flatbed printing machine 10 having a printing station 12 and a rotary indexing table 14 with a total of four printing tables 16, 18, 20 and 22 uniformly distributed along the circumference of the rotary indexing table 14. The rotary indexing table 14 can be further rotated clockwise by 90° respectively, as indicated by an arrow 24. In the illustrated condition of the rotary indexing table 14, the printing table 20 in the 6 o'clock position is situated in the printing station 12, in which two solar cell wafers 25, 26 are imprinted with a strip conductor structure by means of screen printing. The solar cell wafers 25, 26 are so-called string-ribbon wafers which have a thickness of approximately 200 µm or less and, furthermore, a surface structure which is not one hundred percent flat. The solar wafers 25, 26 are therefore extremely susceptible to fracturing. In addition to string-ribbon wafers, any other types of wafers can also be processed.

The exemplary printing table 22 in the 9 o'clock position is situated in a discharge and wafer checking station 28. Here, the completely imprinted wafers 27, 29, which rest on the printing table 22, are checked for printing quality and possible damage as a result of fracturing by means of a camera 30 and the image processing devices connected on the output side. If the result of the check is positive—that is when the printing quality corresponds to the requirements and the wafers 27, 29 are not damaged—the latter are transferred from the printing table 22 to a conveying device 32 and are guided to a further processing. If the checks in station 28 reveal a lack of good printing quality or even a fracturing of the wafers, these are also transferred to the conveying device 32, but are then removed from the processing operation. The conveyor belt of the conveying device 32 can, for example, be folded or deflected upward, and the wafers can thereby be removed into a reject container.

In FIG. 1, the printing table 20 in the 12 o'clock position is situated in a conveyor belt checking station 34. In the conveyor belt checking station 34, a paper web 36, which is moving over the printing table 16 and is used for conveying the wafers, is checked for soiling contamination and damage by means of a camera 38 and/or a camera 39 and associated image processing devices connected to the output side. When a wafer is broken during the imprinting, it may happen that splinters of the wafer or ink residue adhere to the paper web 36. This soiled section of the paper web 36 should therefore no longer be used for subsequent printing operations because there may be the risk that subsequent solar cell wafers will be soiled or even damaged.

If the check in station 34 reveals that the conveyor belt section of the paper web 36 is soiled or damaged, a driving device for the paper web 36 is triggered by means of a control unit 40 in such a manner that the soiled conveyor belt section is removed from the printing table surface, and a new clean conveyor belt section is situated on it. For this purpose, the control unit 40 receives input signals from the image processing devices of the cameras 30, 38 and triggers driving devices of the printing tables 16, 18, 20 and 22 by way of connections which are not shown.

The exemplary printing table 18 in the 3 o'clock position is situated in a transfer station 42, a so-called pick and place station, in which, using the schematically illustrated devices 44, the wafers 45, 46 are removed from a magazine and are placed in a precise position on the printing table 18. Devices 44 may include a vacuum suction device on a gripping arm and a camera. Two solar cell wafers 45, 46 respectively are positioned on the conveyor belt—for example the paper web 36—of the printing table 18. In station 42, the wafers 45, 46 are therefore positioned in a predefined position on the printing table 18 and are fixed in this predefined position by the application of a vacuum to the printing table. For this purpose, the paper web 36 has an air-permeable construction.

According to the invention, it is therefore provided to position the solar cell wafers on a conveyor belt, especially on the paper web 36, by means of the devices 44, to then fix the solar cell wafers on the paper web 36 in a printing position and to imprint the solar cell wafers in this fixed printing position. After the imprinting, the paper web 36 can be used for further conveying the solar cell wafers and to transfer them to a conveyor belt or other conveying device. Should the paper web 36 have been damaged or soiled in the conveyor belt section on which the wafers are situated during the imprinting of the wafer or previously during the fixing, this damage may be detected in station 34. As a function of the checking result, a soiled or damaged conveyor belt section of the paper web 36 is then moved out of the processing area on the printing table 16 and a new clean and undamaged conveyor belt section of the paper web 36 is moved into the processing area. If the check in station 34 shows that the conveyor belt section of the paper web 36 is clean and undamaged, the latter can remain in the processing area or can be moved back into the processing area, and is used in station 42 again for the transport of additional solar cell wafers. In this fashion, a conveyor belt section of the paper web 36 has to be changed only when a soiling or damage is detected, so that paper web consumption is significantly reduced and, downtimes of the flatbed printing machine 10 by changing the paper web 36 are also significantly reduced.

Figure 2:
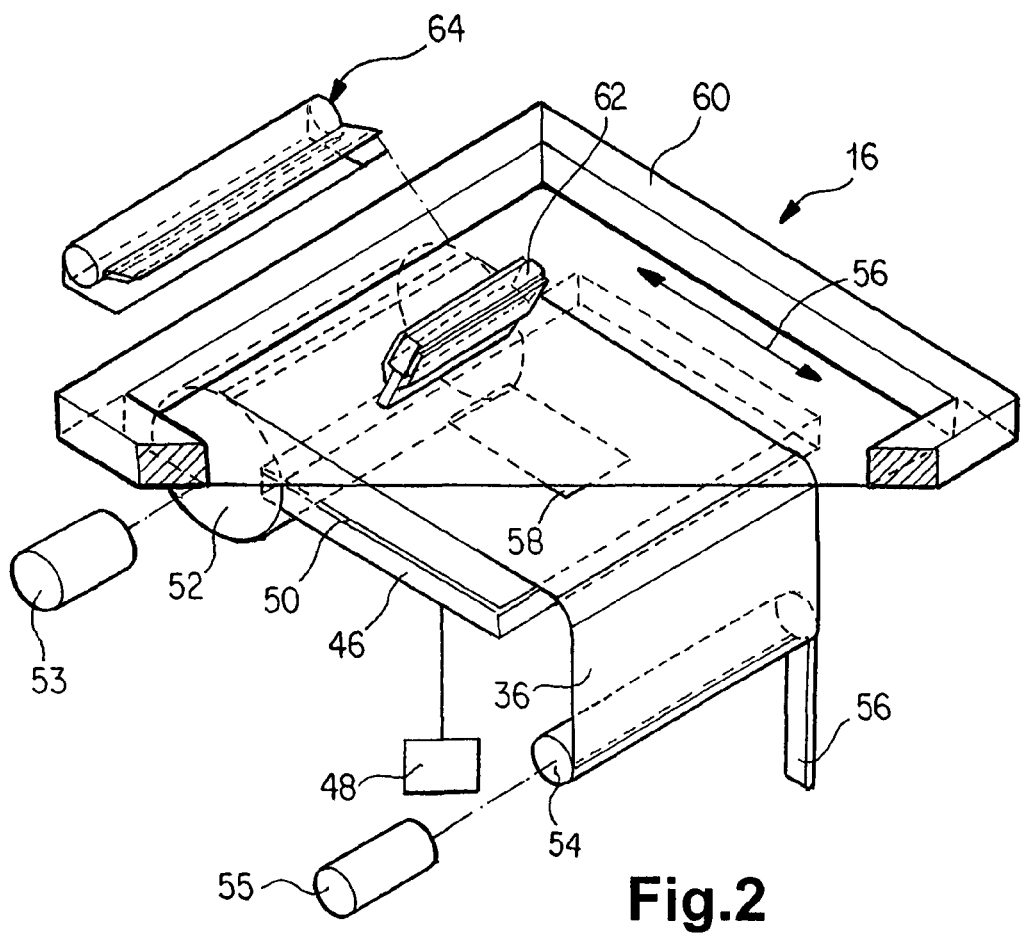
FIG. 2 is a schematic representation of a printing table according to the invention, in the printing position.

The exemplary schematic perspective representation of FIG. 2 shows the printing table 16 according to an embodiment of the invention in sections. Here, it should be noted that the printing tables 16, 18, 20 and 22 have an identical construction and can all be triggered by means of the control unit 40, schematically illustrated in FIG. 1.

The printing table 16 in FIG. 2 has a printing table bearing device 46 which may be provided with intake openings to which a vacuum can be applied by means of a suction pump 48. The suction pump 48 is triggered by the control unit 40. On its top side, the printing table bearing device 46 is equipped with an elastic rubber coating 50 which has passage openings (not shown in the drawing) in the raster of the intake openings of the printing table bearing device 46, also not illustrated. The paper web 36 is tensioned by way of the rubber coating 50. On one side of the printing table, the paper web 36 is wound onto a first roller 52 and, on the other side of the printing table bearing device 46, the paper web 36 is wound onto a second roller 54. The rollers 52 and 54 are each equipped with driving devices 53, 55, which can be triggered by the control unit 40 illustrated in FIG. 1. In this case, as indicated by a double arrow 56, the paper web 36 can be moved in two mutually opposite directions over the printing table bearing device 46. The second roller 54 is displaceably disposed on guide rails 56, shown schematically. In the representation of FIG. 2, only one guide rail 56, which is arranged perpendicular to the printing table bearing surface 46, is schematically shown. Along the guide rail 56, the roller 54 can move perpendicularly to the printing table bearing surface 46. In this case, the second roller 54, together with the schematically outlined driving unit 55, is pulled downward by its own weight along the guide rail 56, and thereby tensions the paper web 36. Thus, when the roller 52 in the representation of FIG. 2 is moved clockwise, the roller 54 moves downward along the guide rail 56. When the roller 52 is moved counterclockwise, the paper web 36 is moved back up onto the roller 52, and the roller 54 is moved upward along the guide rail 56.

As shown in FIG. 1, the solar cell wafers may be conveyed by means of the devices 44 onto the printing table bearing device 46. In contrast, the paper web 36 may be provided for the removal of the wafer, as will be explained in the following.

FIG. 2 shows the wafer 58 in the printing position in which, as explained above, it may be fixed to the paper web 36 by means of a vacuum from a section pump 48. By means of a printing screen 60, a section of which is shown in FIG. 2, and a printing squeegees 62, strip conductors can then be imprinted on the wafer 58. A cleaning device 64, whose function will be explained in the following, is also shown in FIG. 2.

Figure 3:
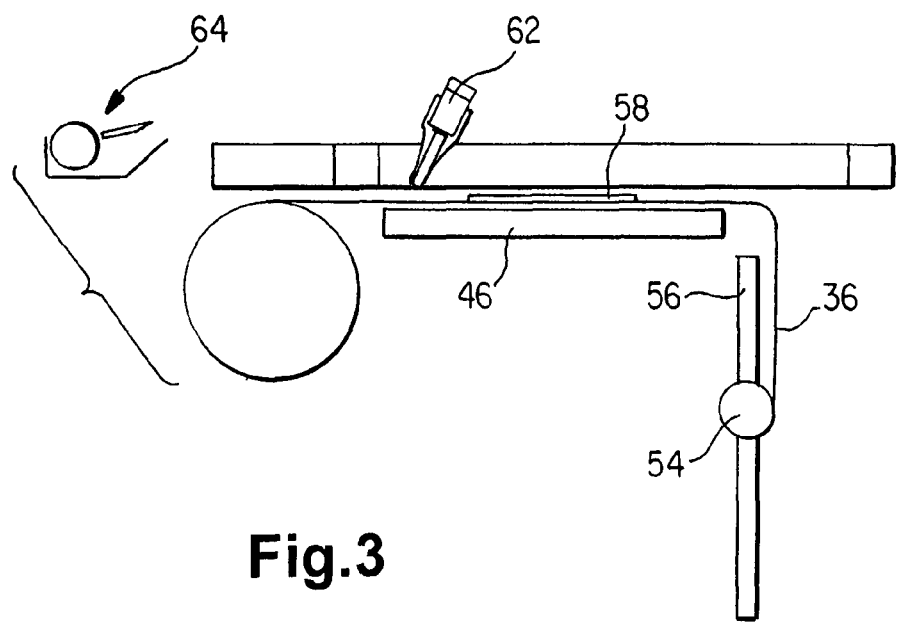
FIG. 3 is a schematic lateral view of the printing table of FIG. 2.

In the schematic lateral view of FIG. 3, which shows the printing table 16 of FIG. 2, the wafer 58 is visible resting on the printing table bearing device 46, the wafer 58 being illustrated with a very exaggerated thickness. The wafer 58 rests on a first conveyor belt section of the paper web 36 and, while being relatively immobile with respect to this first conveyor belt section, is moved down from the printing table bearing device 46 together with this first conveyor belt section.

Figure 4:
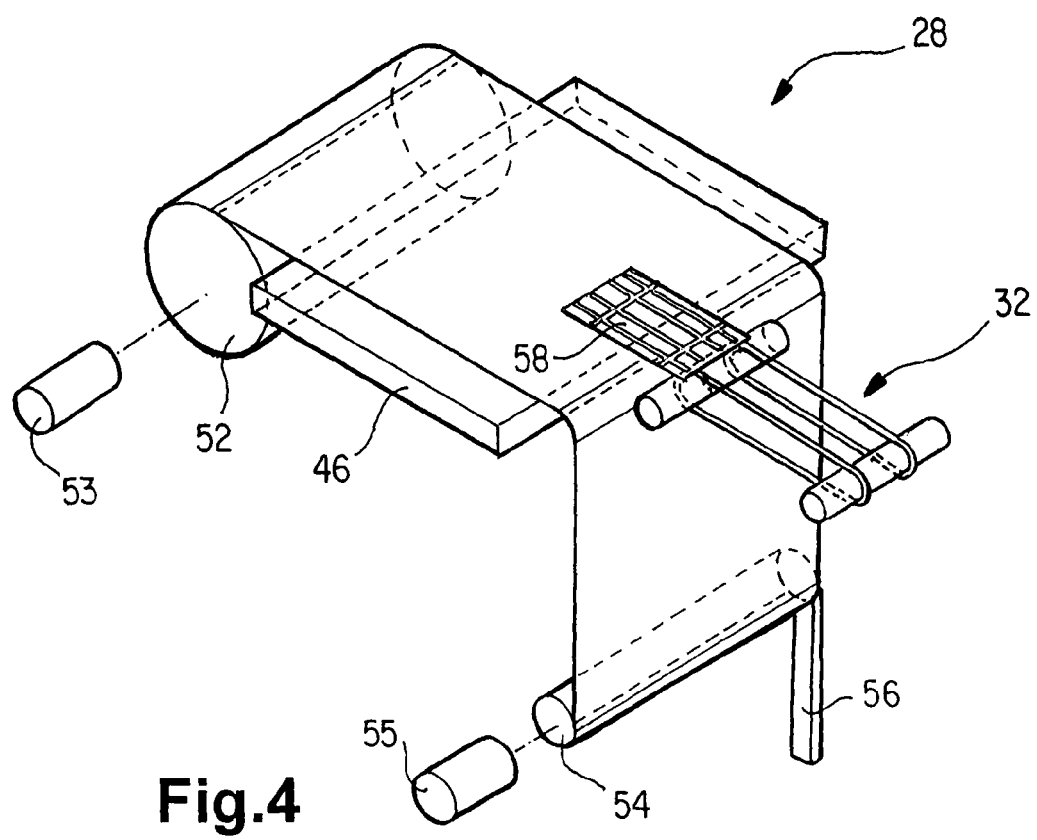
FIG. 4 is a schematic perspective view of the printing table of FIG. 2 during the conveying of imprint material out of the processing area.

This condition is illustrated in FIG. 4 in which the wafer 58, now already imprinted with strip conductors, is moved down from the printing table bearing device 46 and is already situated in sections on the conveying device 32. The representation of FIG. 2 therefore corresponds to the arrangement of the printing table 16 in the printing station 12 of FIG. 1, and the representation of FIG. 4 corresponds to the position of the printing table 22 in station 28 of FIG. 1. It is indicated that the first conveyor belt section, on which the wafer 58 is resting, is moved downward together with the removal of the wafer 58 from the printing table bearing device 46.

The roller 54 is moved downward along the guide rail 56 substantially simultaneously with the first conveyor belt section. In order to move the first conveyor belt section of the paper web 36 downward off the printing table bearing device 46, only roller 52 is therefore caused to rotate clockwise. In contrast, roller 54 slides downward along the guide rail 56 and does not rotate. The roller 54 may be equipped, for example, with a blockable free-wheel.

Figure 5:
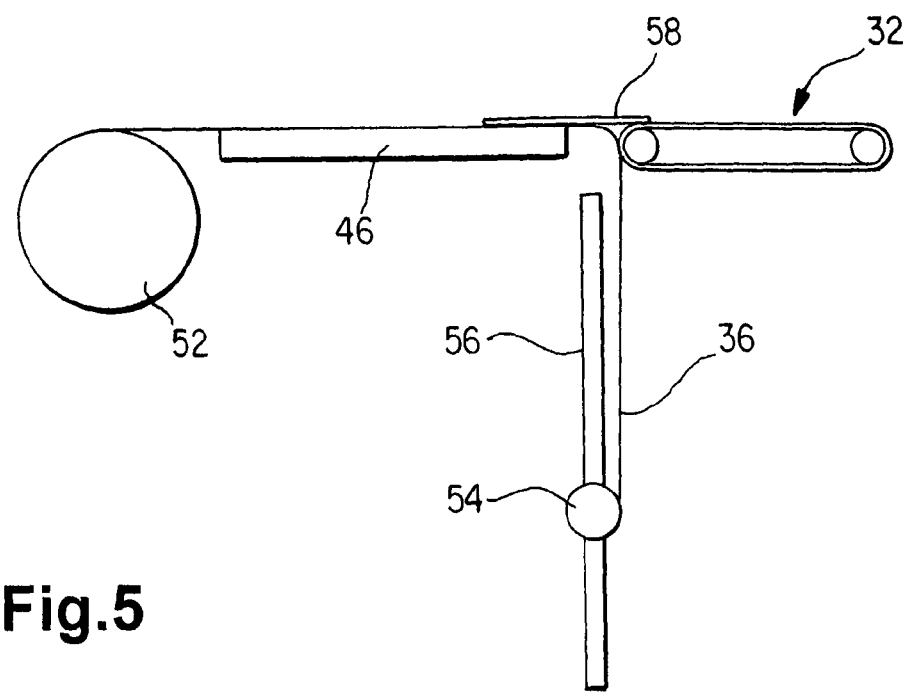
FIG. 5 is a schematic lateral view of the printing table of FIG. 4.

A lateral view of the printing table 22 of FIG. 4 is shown in FIG. 5, which also shows that the wafer 58 partially still rests on the first conveyor belt section of the paper web 36, and partially already rests on the conveying device 32. In contrast to the representations in FIGS. 2 and 3, the roller 54 is shown in a downward-displaced position.

Figure 6:
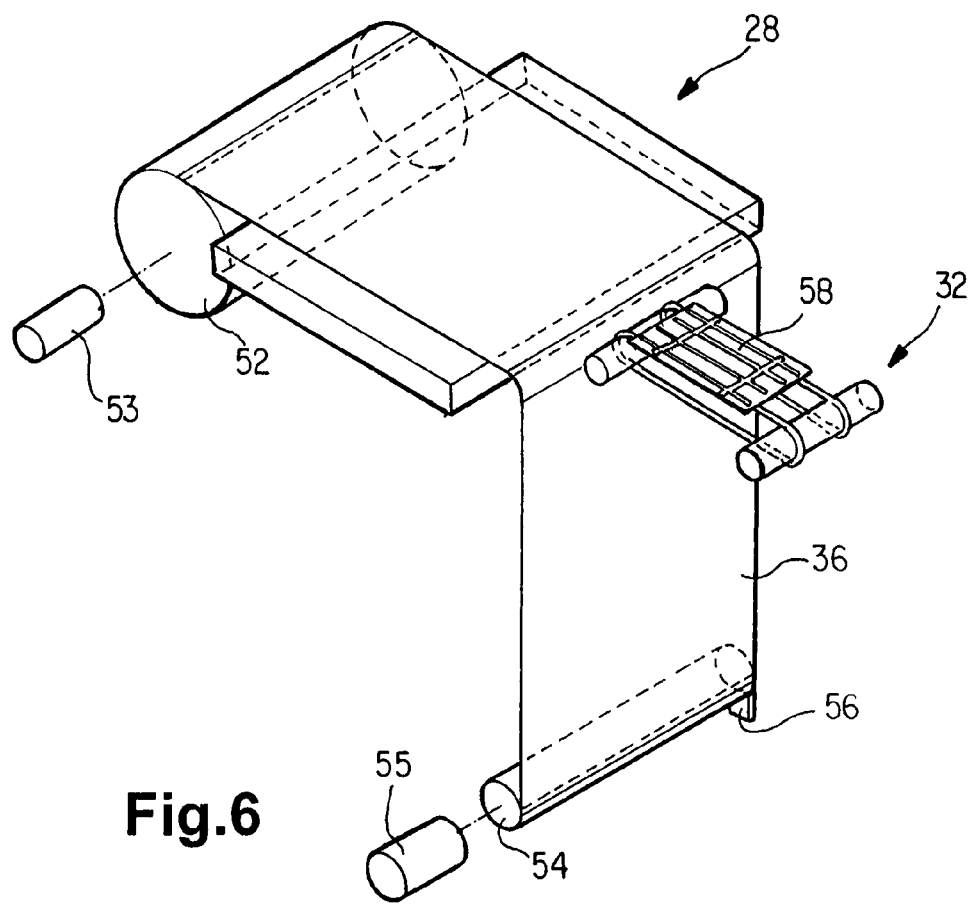
FIG. 6 is a schematic perspective view of the printing table of FIG. 2 when the imprint material is completely removed from the processing area.

FIG. 6 illustrates the printing table 22 when the wafer already rests completely on the conveying device 32 and when the first conveyor belt section of the paper web 36 is now completely pulled off the printing table bearing device 46. The first conveyor belt section is therefore situated in an area 66 shown in FIGS. 4 and 5, and can be checked for soiling and damage. According to the invention, the first conveyor belt section may be first moved downward from the printing table bearing device 46, and may be then moved back onto the printing table bearing device 46 in order to check the first conveyor belt section from above (while it is in its position on the printing table bearing device 46) for soiling and damage. Alternatively, according to the invention the first conveyor belt section may be checked in the area 66 outside the printing table bearing device 46. The exemplary embodiments of FIGS. 2 to 7 are simply illustrative of the basic method of operation of the process according to the invention, and of the printing table according to the invention.

Figure 8:
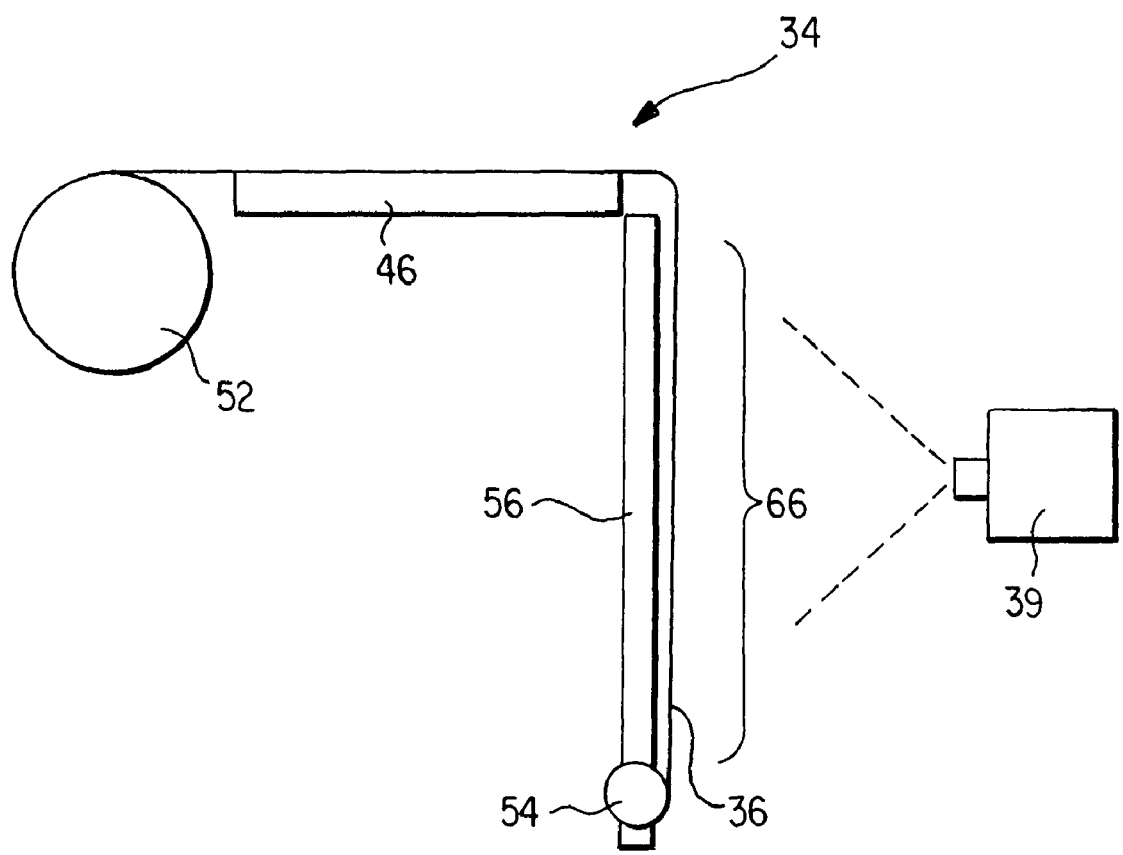
FIG. 8 is a schematic lateral view of the printing table of FIG. 6 during the checking of a conveyor belt section.

FIG. 8 illustrates the checking of the first conveyor belt section in the area 66 by means of the exemplary camera 39 also shown in FIG. 1. As an alternative, the camera 38 may be used for checking the first conveyor belt section on the printing table bearing surface 46. FIG. 8 shows that the second roller 54 has now almost reached the lower end of the guide rail 56, and the first conveyor belt section is mounted in a flat manner in the area 66, so that it can be reliably check for soiling or damage.

Figure 7:
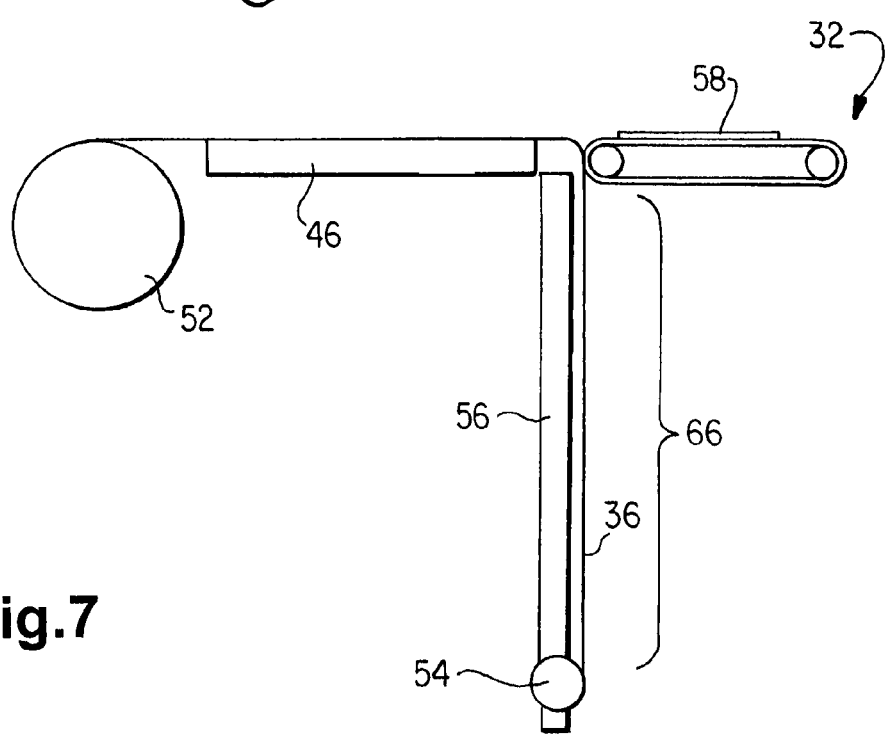
FIG. 7 is a schematic lateral view of the printing table of FIG. 6.

If the check by means of the camera 39 and the image processing methods connected on its output side reveals that the first conveyor belt section, corresponding to the area 66 of FIGS. 7 and 8, is undamaged and clean, the control unit 40 may trigger the driving device 53 of the roller 52 such that the area 66, corresponding to the first conveyor belt section, is returned on the printing table bearing device 46. This condition corresponds to the one illustrated in FIG. 2. In this exemplary embodiment, during the counterclockwise rotation of the first roller 52, the second roller 54 does not rotate but is moved upward along the guide rail 56.

If, in contrast, the check by means of the camera 38 reveals that the first conveyor belt section of the area 66 is damaged or soiled, for example; because the wafer 58 was broken during the printing operation, a second clean conveyor belt section of the paper web 36 is moved onto the printing table bearing device 46. Starting from the basic configuration shown in FIGS. 6 and 7, the paper web 36 would remain in the illustrated position in area 66, which a new section of the paper web 36 is already situated above the printing table bearing device 46. In this case, the first roller 52 would remain immobile, but the control unit 40 of FIG. 2 will then trigger the driving device 55 of the second roller 54 such that the second roller 54 rotates clockwise. The soiled first conveyor belt section in the area 66 is thereby wound onto the second roller 54 and simultaneously the second roller 54 moves upward along the guide rail 56 during the winding-up. The clockwise rotation of the second roller 54 is stopped as soon as the second roller 54 has again reached the position illustrated in FIG. 2.

According to the exemplary embodiment described above, the second roller 54, onto which the soiled paper web 36 is wound, always rotates in only one direction, which in the illustrated example is clockwise. If the first conveyor belt section is now soiled by printing paste, this may result in that two paper web sections, which come to rest upon one another, become glued to one another on the roller 54. This is not critical in the case of the printing table according to the invention, because the second roller 54 is always rotated only clockwise and soiled paper web sections no longer have to be unwound from the second roller 54. Even the gluing-together of the soiled paper web sections on the second roller 54 thus does not lead to a blocking or jamming of the paper web 36, thus considerably improving the reliability of the printing table according to the invention.

Figure 9:
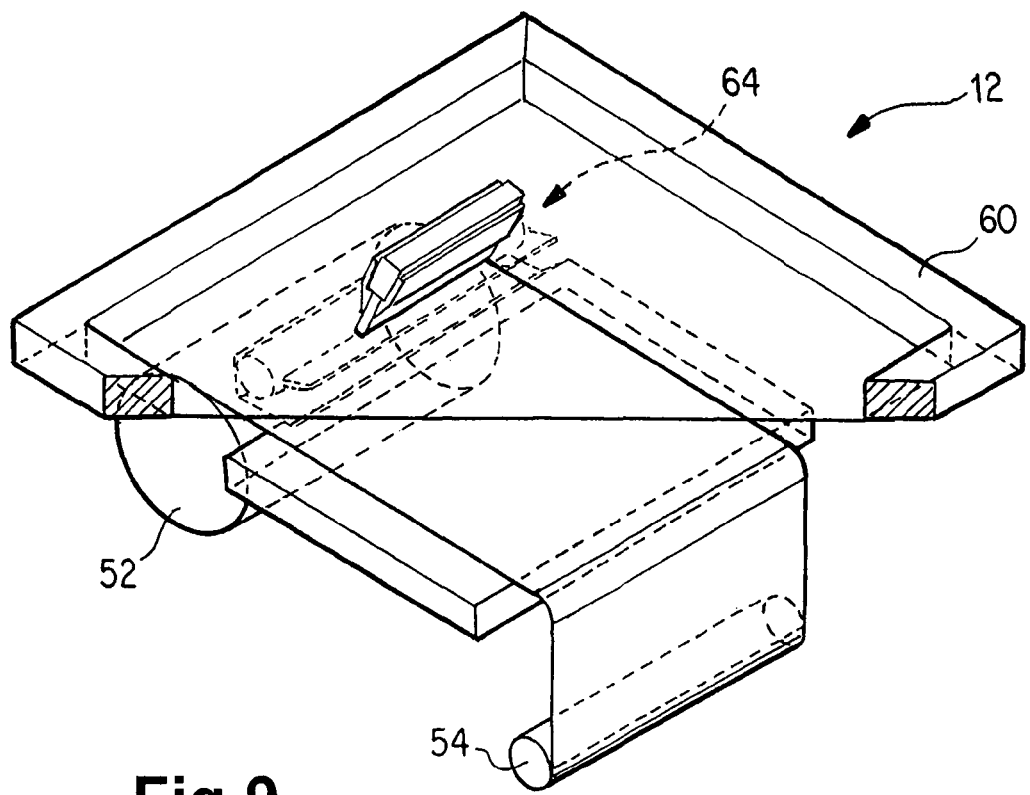
FIG. 9 a schematic perspective representation of the printing table of FIG. 2 at the start of a cleaning operation.
Figure 10:
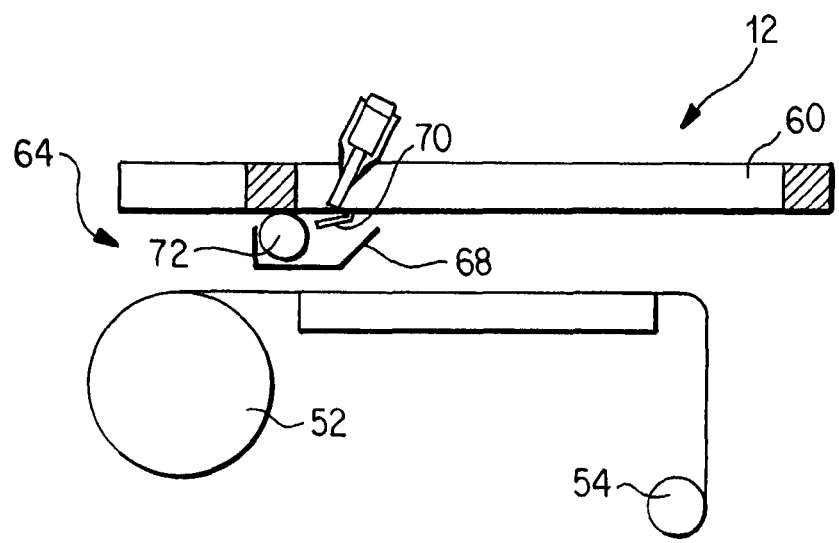
FIG. 10 is a schematic lateral view of the printing table of FIG. 8.
Figure 11:
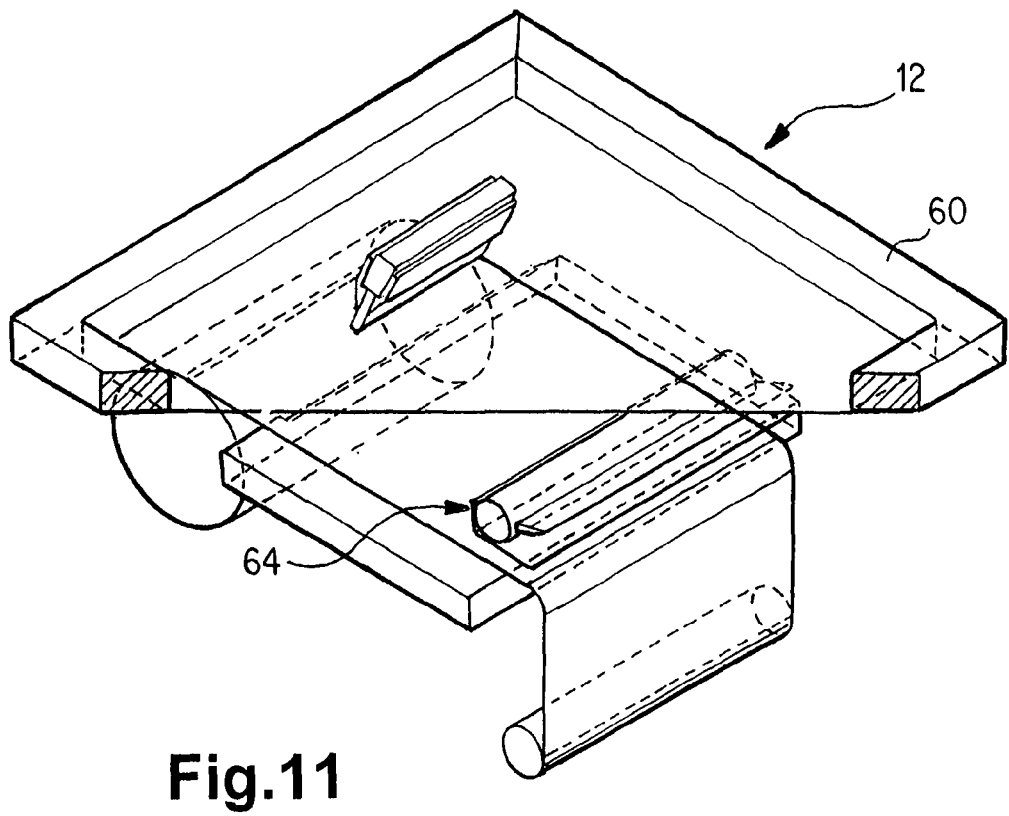
FIG. 11 is a schematically perspective view of the printing table of FIG. 2 shortly before the end of a cleaning operation.
Figure 12:
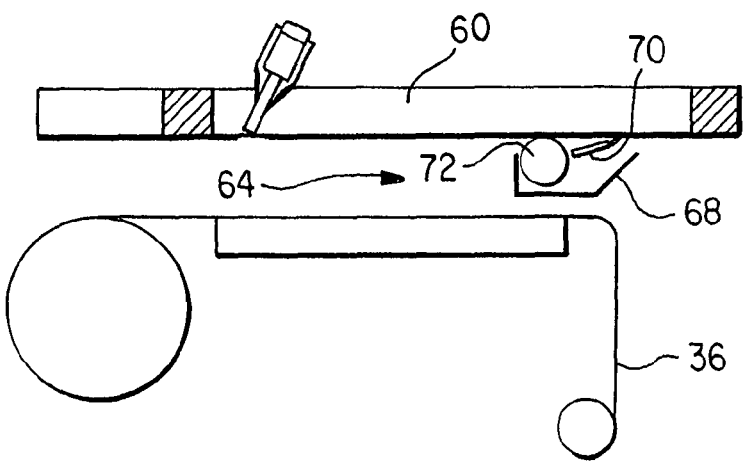
FIG. 12 is a schematic lateral view of the printing table of FIG. 10.

The operation of the cleaning device 64 will be described by means of FIGS. 9 to 12. As illustrated in FIGS. 8 and 9, the cleaning device 64 has a trough 68, a scraper 70 and a moistening roller 72. The trough 68 may be filled with water or a suitable liquid, and the roller 72 at least partially immersed in the liquid in the trough 68. When the roller 72 is rotated, its circumference is therefore wetted by the liquid, and the liquid can be transferred to the bottom side of the printing screen 60. If, during the checking of the wafers 27, 29 in station 28 of FIG. 1, it is detected that the wafers 27, 29 were damaged during the printing operation, either a checking of the printing screen 60 can be carried out, or a cleaning operation of the printing screen 60 can be initiated without a further checking of the printing screen 60. For this cleaning operation, the printing screen 60 may be raised from the printing position with respect to the printing table bearing device 46, and may then be situated in the position illustrated in FIGS. 9 to 12. Starting from the position illustrated in FIGS. 2 and 4, the cleaning device 64 may then be moved below the printing screen 60, so that the scraper 70 rests with its upper edge against the printing screen 60. As illustrated in FIGS. 9 to 12, the cleaning device 64 is then moved along the printing screen 60, so that, by means of the scraper 70, the underside of the printing screen 60 facing the printing table bearing device 46 and the paper web 36 is pulled off and is thereby cleaned of ink residues and, as required, of wafer splinters. In the illustrated embodiment of the cleaning device 64, the moistening may take place by means of the moistening roller 72 after the scraping-off step. As required, after a first passage through the cleaning device 64, another scraping operation can be carried out by means of the scraper 70. After the conclusion of the cleaning operation, the cleaning device 64 is again displaced into the position illustrated in FIG. 2, and the printing screen 60 is lowered back into the printing position also illustrated in FIG. 2.

To clean the printing screen 60, if required, in addition to the scraping by means of the cleaning device 64, a free-printing of the printing screen 60 onto the paper web 36 can take place. For this purpose, the paper web 36 may be directly imprinted instead of a wafer, in order to transfer a possible soiling of the printing screen 60 to the paper web 36. After the printing operation, the imprinted first conveyor belt section of the paper web 36 is then wound onto the second roller 54, and is no longer used. An additional camera may be used to perform another visual checking of the printing image resulting on the paper web 36, in order to detect possible damage or soiling of the printing screen 60 by evaluating the resulting printing image on the paper web 36. As a function of this check, either another cleaning operation can be initiated by means of the cleaning device 64 and/or another free-printing operation can be initiated.

FIGS. 13, 14 show a schematic top view of a system 100 for imprinting solar cell wafers 58. The exemplary rotary indexing table 14 according to the invention, in whose 6 o'clock position the solar cell wafers 58 are imprinted with strip conductors, is an element of the system.

In the 3 o'clock position of the rotary indexing table 14, i.e., the right side of it in FIG. 13, the wafers 58 are mutually aligned by means of the device 44 and are positioned on the paper web in the 3 o'clock position. For this purpose, the device 44 has suction devices used to take two wafers 58 at a time from a first conveyor belt 102. The position that may be taken by the device 44 over the conveyor belt 102 is indicated by a broken line. After the lifting-off of two wafers 58 by means of the device 44, the two wafers 58 now situated on the device 44 are precisely aligned with respect to one another. This mutual alignment of the two wafers 58 takes place according to a preadjustment coordinated precisely to correspond to the design of the printing screen at the rotary indexing table 14. In one exemplary embodiment, the suction devices of the device 44 can be moved relative to one another, such that the two wafers 58 situated in the device 44 can be displaced with respect to one another along two axes in the horizontal plane, and can also be rotated relative to one another about a vertical axis which extends perpendicularly from the plane of FIG. 13.

After the two wafers 58 have been aligned in the device 44 substantially corresponding to the printing copy on the printing screen, the device 44 is moved to the rotary indexing table 14 so it may place the two wafers 58 on the paper web in the 3 o'clock position. As explained above, the wafers 58 may be held on the paper web by means of a vacuum. The device 44 can then again be lifted off the wafers 58 and return into the position above the conveyor belt 102. The position of the device 44 above the 3 o'clock position of the rotary indexing table 14 is shown by a broken line in FIG. 13. The very fragile wafers 58 are lifted by means of the device 44 by using a vacuum and, while in the lifted condition, are aligned relative to one another. Accordingly, they do not have to be pushed back and forth on a base and also do not have to be placed against stops for the alignment. As a result, it can be ensured that the mutual alignment of the wafers 58 causes no high mechanical stress with the risk of damage. The wafers 58 are then deposited on the paper web of the printing table 14. Since they are already in the correct alignment with respect to one another, and are also deposited by the device 44 in the position substantially corresponding to the printing screen, they no longer have to be moved once deposited on the paper web.

The individual solar cell wafers 58 are moved along a direction shown by arrow 104 on the conveyor belt 102. By means of a camera 106, two solar cell wafers 58 respectively are then checked for damage by a transmitted-light method. If the check shows that both checked wafers 58 are in order, these are moved along on the conveyor belt 102 and are then taken over by the device 44.

If the check reveals that one of the two wafers is damaged, the device 44 picks up only the wafer that is undamaged and found to be good. The damaged wafer is simply conveyed further in the direction of the arrow 104 and falls into a reject container at the end of the belt 102. The wafer 58 that was found to be good is then deposited in a parked position 108 by means of the device 44. Subsequently, two additional wafers 58 are then conveyed to the end of the belt 102 and, if both wafers 58 are found to be good, are taken up by the device 44.

The wafer 58 left in the parked position 108 remains there until one of the two additional wafers 58 on conveyor belt 102 is found to be bad. Then the device 44 takes the wafer 58 out of the parked position 108, then picks up the one wafer found to be good from the conveyor belt 102, and can in this manner again convey two wafers to the rotary indexing table 14.

According to this embodiment, groups of two wafers 58 can in each case be checked and conveyed jointly, and a so-called double benefit is obtained in that two solar cell wafers 58 always simultaneously imprinted on the rotary indexing table 14. Those of skill in the art will understand that it is possible to simultaneously imprint more than two wafers 58 using a parking scheme according to the invention.

After the imprinting of the wafers 58 on the rotary indexing table 14, these are transferred in the 9 o'clock position by means of the conveyor belt to a magazine device 110. The magazine device 110 may have two mutually spaced conveyor belts 112, on which the edge areas of the wafers 58 are placed and which are both moved such that their respective upper bearing surface, on which the wafers 58 are placed, moves in a synchronized manner in the direction of the arrow 114. The wafers 58 are thereby transferred by means of the paper belt on the rotary indexing table 114 to the magazine device 110 and, in the representation of FIG. 13, are then moved downward. The representation of FIG. 13 is only schematic, and a distance between the conveyor belt 112 on the right and the paper belt in the 9 o'clock position of the rotary indexing table 14 in reality is selected to be sufficiently close that the wafers 58 can be easily transferred thereon.

Ten wafers 58 may be arranged side-by-side in the exemplary magazine device, as illustrated in FIG. 13. When a total of ten wafers 58 are arranged side-by-side, transverse conveyor belts 116 extending between the conveyor belts 112 and perpendicular thereto are lifted so that their top surfaces rise over the level of the conveyor belts 112. As a result, also the wafers 58 situated over the transverse conveyor belts 116, shown in FIG. 13 in outline form by a broken line, are lifted above the level of the conveyor belts 112 and can be transferred by means of the conveyor belts 116 perpendicular to the moving direction 114 of the conveyor belts 112 to an additional conveyor belt 118. On the additional conveyor belt 118, ten wafers 58 that are placed side-by-side can then be jointly moved by means of the additional conveyor belt 118 in the direction of the arrow 120. The additional conveyor belt 118 is directed to a run-through dryer 122, through which the ten wafers 58 can pass simultaneously. A high throughput of the system 100 can be achieved according to this exemplary embodiment and, in particular, the high throughput achieved by the explained double benefit of the rotary indexing table 14 is not reduced as a result of the run-through dryer 122.

The run-through dryer 122 may be followed by another magazine device by means of which the wafers 58 can then again be separated into groups of two and can be subjected, for example, to a further imprinting operation. For example, if the underside of the wafers 58 still has to be imprinted, a turning device may also be connected in front of the magazine device, by means of which turning device, the respective ten wafers are lifted, are rotated by 180° and are deposited again on a conveyor device.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method of conveying imprint material from a processing area of a flatbed printing machine, the method comprising the acts of:
    positioning the imprint material on a first conveyor belt section of a conveyor belt in the processing area;
    processing the imprint material, further moving the imprint material on the first conveyor belt section out of the processing area;
    removing the processed imprint material from the first conveyor belt section;
    performing an automatic check of the first conveyor belt section for soiling or damage; and
    as a function of a result of the check, performing one of positioning another imprint material on the first conveyer belt section and moving of a second conveyor belt section into the processing area.

2. Method according to claim 1, further comprising moving the first conveyor belt section back into the processing area as a function of the result of the check.

3. Method according to claim 1, further comprising moving the first conveyor belt section back into the processing area and, as a function of the result of the check, moving the second conveyor belt section into the processing area.

4. Method according to claim 1, wherein said processing area is located on a printing table, further comprising automatically checking the processed imprint material for damage or soiling on the printing table and, as a function of a result of the checking, performing one of further processing of the imprint material and removal of the imprint material from the printing table.

5. Method according to claim 1, further comprising imprinting of the imprint material in the processing area by means of screen printing, automatically checking a printing screen after the imprinting for damage or soiling, and, as a function of a checking result, scraping of the printing screen by means of a scraper.

6. Method according to claim 5, further comprising moistening of the printing screen before, during or after the scraping.

7. Method according to claim 5, further comprising initiating a checking of the printing screen as a function of a result of an automatic checking of a processed imprint material.

8. Method according to claim 1, wherein the act of processing comprises imprinting of the imprint material in the processing area by means of screen printing, the method further comprising, automatically checking a printing screen after the imprinting for damage or soiling, and, as a function of the checking result, free-printing of the printing screen on to the first conveyor belt section and moving of the second conveyor belt section into the processing area.

9. Method according to claim 8, further comprising automatically checking a printing image of the free-printing on the first conveyor belt section.

10. Method according to claim 1, further comprising the acts of, in a screen printing machine, aligning at least two of imprint material plates relative to one another;

positioning of the at least two aligned imprint material plates in a processing area of the screen printing machine;
   simultaneously processing the at least two imprint material plates; and
   further moving the at least two imprint material plates out of the processing area.

11. Method according to claim 10, wherein the aligning step comprises lifting of the at least two imprint material plates and moving of the at least two imprint material plates in the lifted condition relative to one another.

12. Method according to claim 10, further comprising simultaneously checking the at least two imprint material plates and, when detecting imprint material plates evaluated as bad, sorting-out the imprint material plates evaluated as bad.

13. Method according to claim 10, further comprising drying of the processed imprint material plates in a run-through dryer, at least four processed imprint material plates being arranged side-by-side on a conveyor belt of the run-through dryer.

14. Method according to claim 10, further comprising at least one of lifting and swiveling of a printing screen during printing.

15. The method according to claim 1, wherein the imprint material comprises solar cell wafers.

16. Method according to claim 10, further comprising simultaneously checking the at least two imprint material plates and, when detecting at least one imprint material plate as bad and at least one imprint material plate as good, moving imprint material plates evaluated as good into a parked position.

* * * * *